United States Patent
Tsuno et al.

(10) Patent No.: US 6,195,034 B1
(45) Date of Patent: Feb. 27, 2001

(54) RADIO WAVE ABSORBING PANEL

(75) Inventors: Toshio Tsuno; Masao Misonou; Harunobu Yoshida; Motoyasu Togashi, all of Osaka; Kenichi Hyodo, Minato-ku, all of (JP)

(73) Assignees: Nippon Sheet Glass Co., Ltd., Osaka; Nippon Sheet Glass Technoresearch Co., Ltd., Hyougo; Yagi Antenna Co., Ltd., Tokyo; Takenaka Corp., Osaka, all of (JP)

( * ) Notice: Subject to any disclaimer, the term of this patent is extended or adjusted under 35 U.S.C. 154(b) by 0 days.

(21) Appl. No.: 09/171,210

(22) PCT Filed: Mar. 30, 1998

(86) PCT No.: PCT/JP98/01435

§ 371 Date: Jun. 4, 1999

§ 102(e) Date: Jun. 4, 1999

(87) PCT Pub. No.: WO98/44772

PCT Pub. Date: Oct. 8, 1998

(30) Foreign Application Priority Data

Mar. 31, 1997 (JP) .......................................... 9-81491

(51) Int. Cl.[7] .................................................. H01Q 17/00
(52) U.S. Cl. ....................................................... 342/1; 342/4
(58) Field of Search ..................................... 342/1, 2, 3, 4

(56) References Cited

U.S. PATENT DOCUMENTS

| | | | |
|---|---|---|---|
| 3,733,606 | * | 5/1973 | Johansson ................................. 342/3 |
| 5,085,931 | * | 2/1992 | Boyer, III et al. ..................... 428/328 |
| 5,275,880 | * | 1/1994 | Boyer, III et al. ..................... 428/328 |
| 5,381,149 | * | 1/1995 | Dougherty et al. ...................... 342/1 |
| 5,488,371 | * | 1/1996 | Targrove ................................... 342/1 |
| 5,872,534 | * | 2/1999 | Mayer ...................................... 342/1 |

FOREIGN PATENT DOCUMENTS

| | | |
|---|---|---|
| 2 202 858 | 5/1974 | (FR) . |
| 2 064 629 | 6/1981 | (GB) . |
| 3-250797 | 11/1991 | (JP) . |
| 5-37178 | 2/1993 | (JP) . |
| 5-42623 | 2/1993 | (JP) . |
| 5-50548 | 3/1993 | (JP) . |
| 5-243784 | 12/1993 | (JP) . |
| 7-242441 | 9/1995 | (JP) . |

OTHER PUBLICATIONS

Jun. 17, 1998 PCT International Search Report for PCT/JP98/01435.

"Characterisation of conducting polymer–loaded composite materials at oblique incidence and their application in radar absorbers", Wong, T.C.P.; Chambers, B.; Anderson, A.P.; Wright, P.V., Antennas and Propagation, 1995., Ninth International Conference on.*

* cited by examiner

*Primary Examiner*—John B. Sotomayor
(74) *Attorney, Agent, or Firm*—Merchant & Gould P.C.

(57) ABSTRACT

A radio wave absorbing panel is made up of a first insulating substrate and a second insulating substrate disposed in parallel a predetermined distance apart and a middle insulating substrate disposed between and parallel with the first and second substrates. The first and second substrates each have a conducting film coated over the entire surface of one side. On one side of the middle insulating substrate are coated multiple conducting films disposed in the form of stripes or a matrix. By this means a thin radio wave absorbing panel having excellent radio wave absorption and transparency to light can be obtained.

8 Claims, 5 Drawing Sheets

RADIO WAVE ABSORBING PANEL

TECHNICAL FIELD

The present invention relates generally to a radio wave absorbing panel used for absorbing radio waves incident on a building and, more particularly, to a radio wave absorbing panel which both absorbs incident radio waves and transmits visible light.

BACKGROUND ART

In recent years, along with increases in numbers of high-rise buildings, cases of radio waves of TV frequency bands such as VHF and UHF being reflected by buildings have become more common. Consequently, ghosting, which arises on a TV screen when radio waves arriving at the antenna of a TV receiver directly from a TV station (direct waves) and radio waves reflected by buildings (reflected waves) are incident on the antenna simultaneously, have become a serious social problem. For this reason, with the object of reducing the number of these radio waves reflected by exterior walls of buildings, radio wave absorbing panels made of magnetic materials such as ferrite have been affixed to or embedded in exterior walls to absorb radio waves incident on buildings.

For window glass installed in building window openings, to reduce air-conditioning cooling loads in summer (to save energy), glass coated with a film having a heat ray reflecting function has been used; however, because films having a high heat ray reflecting capability have low electrical resistance, their reflectivity of radio waves is high and they are a cause of radio wave obstruction.

Radio wave absorbing panels for reducing radio wave reflection in which ferrite is used cannot be applied to window openings of building because ferrite does not transmit visible light. Consequently the situation has been that heat ray reflecting ability has been sacrificed and transparent heat ray reflecting films having relatively high electrical resistance have been coated on windows of buildings to reduce radio wave reflection and prevent radio wave obstruction by transmitting radio waves through window openings into buildings.

Concerning window glass for buildings and vehicles, technology is known (from, for example, Japanese Patent Laid-Open Publication Nos. HEI 3-250797, HEI 5-042623, HEI 5-050548 and HEI 7-242441), whereby, with the object of preventing obstruction due to radio wave reflection of high-performance heat ray reflecting films, high heat ray reflectivity and low radio wave reflectivity are realized at the same time by a conducting film being divided up into areas of a size amply smaller than the wavelength of incident radio waves to raise its radio wave transmittivity.

Radio wave absorbing panels in the related art which have radio wave transmittivity are an attempt to prevent radio wave reflection problems by providing window glass of buildings with radio wave transmittivity; however, associated with these there are the problems that incoming radio waves penetrate to the inside of the building and affect office equipment such as personal computers and that electromagnetic waves radiated from electronic appliances inside the building leak through the window glass to outside the building. Although this kind of radio wave obstruction is expected to increase in the future, no effective countermeasure has been taken besides reflecting and thereby blocking radio waves by using a conducting wire mesh or a conducting film on windows of buildings, and in districts where there is a likelihood of a radio wave reflection obstruction arising it has been difficult to build buildings which have large-area windows and block radio waves.

To solve this problem, it is necessary to create a practically usable transparent panel which absorbs radio waves instead of reflecting or transmitting them.

At present there are radio wave absorbing panels made by disposing in parallel two transparent substrates each coated with a conducting film having a controlled sheet resistivity, with which panels it is possible to realize a high radio wave absorbing capacity by utilizing resonance caused by interference of multiple reflections of radio waves. However, to absorb VHF band (about 100 MHz) radio waves, the gap between the two substrates constituting the radio wave absorbing panel must be made from several tens of cm to over a meter, and therefore such panels cannot be realistically applied to ordinary windows of buildings.

DISCLOSURE OF THE INVENTION

It is therefore an object of the present invention to provide a radio wave absorbing panel having superior radio wave absorbency and transparency to light.

To achieve this and other objects, the invention provides a radio wave absorbing panel comprising at least two insulating substrates disposed in parallel a predetermined distance apart on at least one side of each of which is formed a continuous conducting film and at least one insulating substrate disposed between these insulating substrates in parallel therewith on a surface of which are formed conducting films disposed in the form of stripes or in the form of a matrix.

As a result, in the invention, even when the relative permittivity of the radio wave absorbing panel is made large and the thickness of the panel is made thin it is possible to make its absorptance of radio waves high, and consequently the invention can be applied for example to a panel for absorbing VHF band radio waves highly suitable for installation in a window opening of a building.

In a radio wave absorbing panel according to the invention, when stripe-form conducting films are used, preferably, the sheet resistivity of the continuous conducting film is from $1\Omega/\square$ to $3000\Omega/\square$ and when the width and the sheet resistivity of each of the conducting films disposed in the form of stripes are respectively written Hcm and $R_{BM}\Omega/\square$ and the insulation resistance of the insulating substrate on which the stripe-form conducting films are formed is written $R_D cm\Omega$, then H, $R_{BM}$ and $R_D$ are set in the ranges of: $1\ cm \leq H \leq 50\ cm$, $1\Omega/\square \leq R_{BM} \leq 40\Omega/\square$, $R_D \geq 30,000\ cm\Omega$. When stripe-form conducting films having these values are used, the relative permittivity of the radio wave absorbing panel can be made large and its absorbtance of radio waves raised, and even if the panel is made thin it is possible to improve its absorbency of radio waves arriving from a fixed direction.

When matrix-form conducting films are used, preferably, the sheet resistivity of the continuous conducting film is from $1\Omega/\square$ to $3000\Omega/\square$ and when the width, the length and the sheet resistivity of each of the conducting films disposed in the form of a matrix are respectively written Hcm, Vcm and $R_{BM}\Omega/\square$ and the insulation resistance of the insulating substrate on which the matrix-form conducting films are formed is written $R_D cm\Omega$, then H, V, $R_{BM}$ and $R_D$ are set in the ranges of: $1\ cm \leq H \leq 50\ cm$, $1\ cm \leq V \leq 50\ cm$, $1\Omega/\square \leq R_{BM} \leq 40\Omega/\square$. When matrix-form conducting films having these values are used, the relative permittivity of the radio wave absorbing panel can be made large and its absorptance of radio waves raised, and even if the panel is made thin it is possible to improve its absorbency of radio waves arriving from any direction.

Also, when stripe-form conducting films are used, preferably, the sheet resistivity of the continuous conducting film formed on the surface of one of the insulating substrates is not more than 30Ω/□ and the sheet resistivity of the continuous conducting film formed on the surface of another of the insulating substrates is from 50Ω/□ to 3000Ω/□ and when the width and the sheet resistivity of each of the conducting films disposed in the form of stripes are respectively written Hcm and $R_{BM}Ω/□$ and the insulation resistance of the insulating substrate on which the conducting films disposed in the form of stripes are formed is written $R_D cmΩ$, then H, $R_{BM}$ and $R_D$ are made: 1 cm≦H≦50 cm, 1Ω/□≦$R_{BM}$≦40Ω/□, $R_D$≧30,000 cmΩ. By making the sheet resistivity of the conducting film on one of the insulating substrates not more than 30 1Ω/□ and the sheet resistivity of the conducting film of another of the insulating substrates from 50Ω/□ to 3000Ω/□ in this way, it is possible to make the panel still thinner while maintaining an ample radio wave absorbency.

And when matrix-form conducting films are used, preferably, the sheet resistivity of the continuous conducting film formed on the surface of one of the insulating substrates is not more than 30Ω/□ and the sheet resistivity of the continuous conducting film formed on the surface of another of the insulating substrates is from 50Ω/□ to 3000Ω/□ and when the width, the length and the sheet resistivity of each of the conducting films disposed in the form of a matrix are respectively written Hcm, Vcm and $R_{BM}Ω/□$ and the insulation resistance of the insulating substrate on which the conducting films disposed in the form of a matrix are formed is written $R_D cmΩ$, then H, V, $R_{BM}$ and $R_D$ are set to: 1 cm≦H≦50 cm, 1 cm≦V≦50 cm, 1Ω/□≦$R_{BM}$≦40Ω/□, $R_D$≧30,000 cmΩ. By making the sheet resistivity of the conducting film on one of the insulating substrates not more than 30Ω/□ and the sheet resistivity of the conducting film of another of the insulating substrates from 50Ω/□ to 3000Ω/□ in this way, and because matrix-form conducting films set to predetermined values are being used, it is possible to make the relative permittivity of the radio wave absorbing panel large and raise its radio wave absorptance.

Preferably, transparent plate glass is sued as the insulating substrates and the stripe or matrix-form conducting films are transparent conducting films composed mainly of $SnO_2$ or $In_2O_3$ or are metal films composed mainly of Ag, Au, Cu or Al, whereby it is possible to lower the sheet resistivity of the conducting films and raise their transmittivity of light.

Also, dry air may be preferably sealed in spaces between the at least two insulating substrates and the at least one insulating substrate on the surface of which are formed conducting films disposed in the form of stripes or a matrix, whereby condensation due to changes in outside temperature can be prevented and deterioration in radio wave absorbing capacity due to water in the conducting films can be prevented.

Alternatively, resin may be preferably sealed in spaces between the at least two insulating substrates and the insulating substrate on the surface of which are formed conducting films disposed in the form of stripes or a matrix to form a laminated glass structure, whereby it is possible to prevent the glass from cracking and scattering.

BRIEF DESCRIPTION OF THE DRAWINGS

Preferred embodiments of the invention will now be described in detail on the basis of the accompanying drawings, wherein.

BEST MODE FOR CARRYING OUT THE INVENTION

The present invention provides a thin radio wave absorbing panel which can be applied to window glass of a building and which both provides transparency to visible light and absorbs radio waves from outside prevent the reflection of radio waves and the transmission of radio waves into the building.

Figure 1:
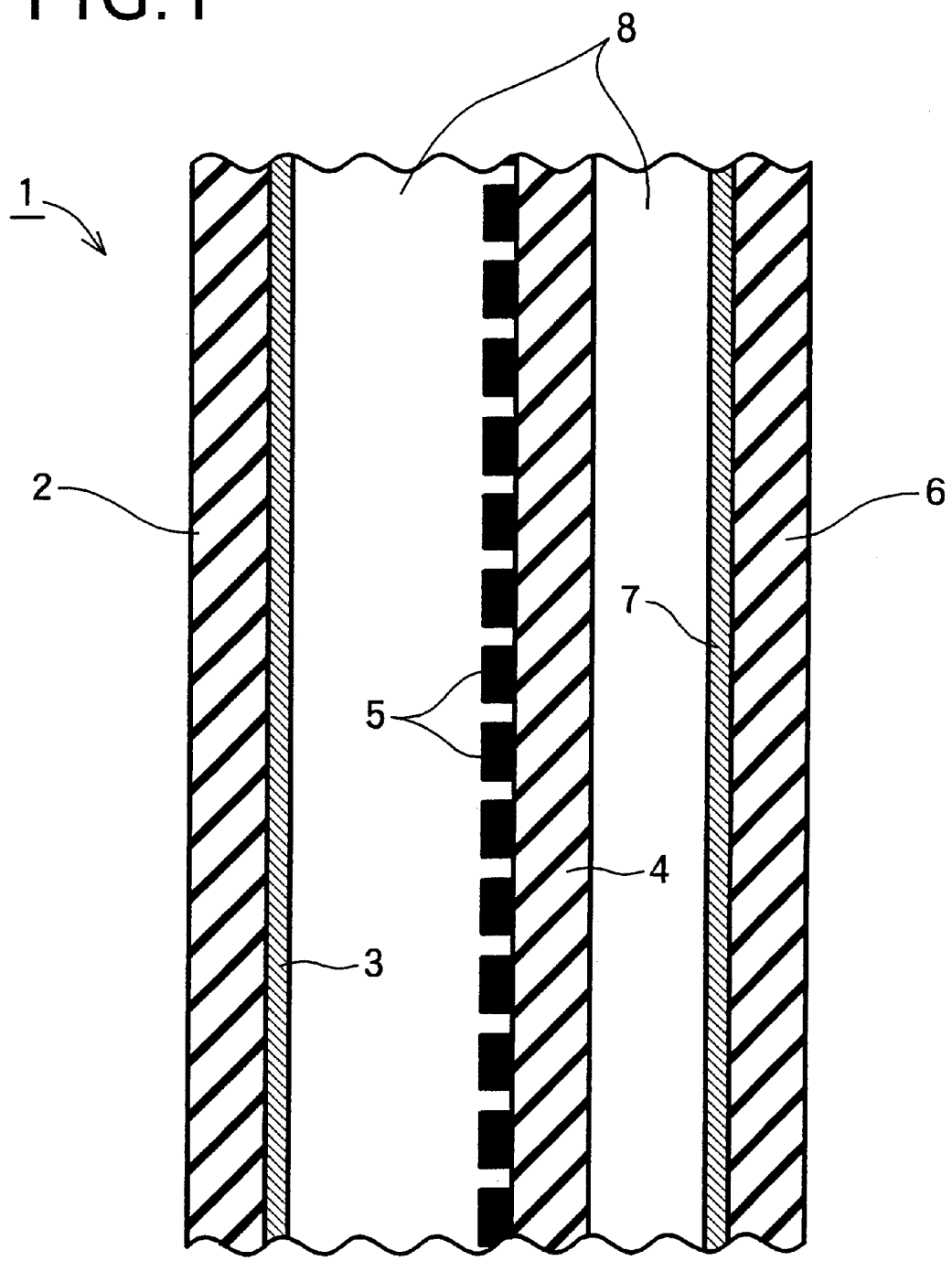
FIG. 1 is a partially sectional view showing the construction of a radio wave absorbing panel according to the invention.

In FIG. 1, a radio wave absorbing panel 1 is made up of a first insulating substrate 2 forming one side of the panel, a first conducting film 3 coated on the entire surface of the inner side of the first insulating substrate 2, a second insulating substrate 6 disposed in parallel with and a predetermined distance away from the first insulating substrate 2 and forming the other side of the panel, a second insulating film 7 coated on the entire surface of the inner side of the second insulating substrate 6, a middle insulating substrate 4 disposed between and in parallel with the first insulating substrate 2 and the second insulating substrate 6, and a conducting film 5 coated on the surface of the middle insulating substrate 4 in the form of stripes or in the form of a matrix. The insulating substrates 2, 6, 4 are fixedly secured and air layers 8 are sealed.

Although in the preferred embodiment shown in FIG. 1 the radio wave absorbing panel 1 has a three-layer structure made up of the first insulating substrate 2, the middle insulating substrate 4 and the second insulating substrate 6, the panel 1 may alternatively be made up of a plurality of such three-layer structures.

Also, the first conducting film 3 and the second insulating film 7 may alternatively be coated continuously on the outer sides of the respective first and second insulating substrates 2 and 6, or may be coated continuously on both sides of the second insulating substrate 6.

Also, a plurality of middle insulating substrates 4 may be disposed between the first insulating substrate 2 and the second insulating substrate 6.

Or, a single middle insulating substrate 4 and one or more ordinary insulating substrates may be disposed between the first insulating substrate 2 and the second insulating substrate 6.

Figure 2:
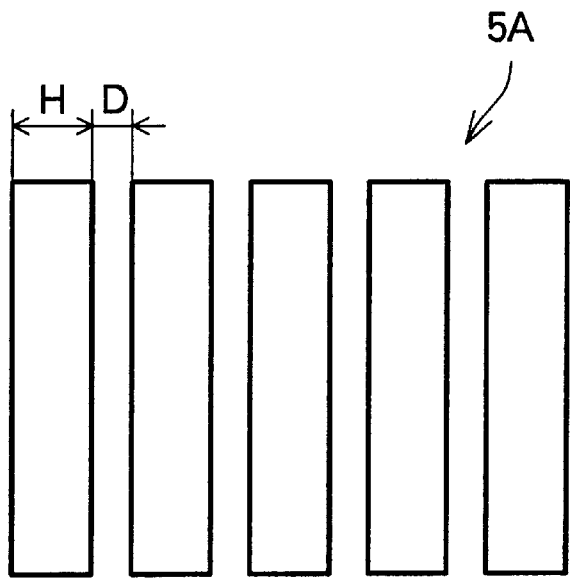
FIG. 2 is a pattern view showing conducting films according to the invention disposed in the form of stripes.

FIG. 2 shows a pattern of stripe-form conducting films of a radio wave absorbing panel according to the invention.

As shown in FIG. 2, stripe-form conducting films 5A have a stripe width H and a gap D between adjacent stripes.

Figure 3:
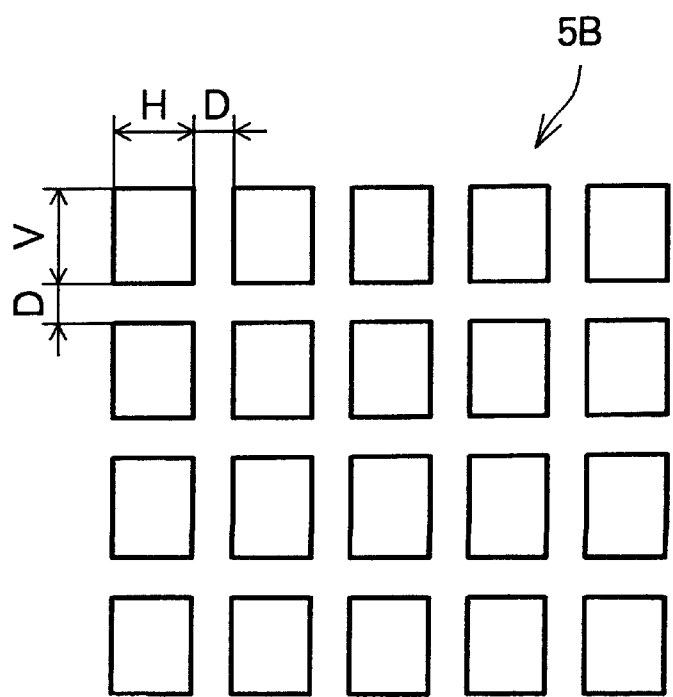
FIG. 3 is a pattern view showing conducting films according to the invention disposed in the form of a matrix.

FIG. 3 shows a pattern of matrix-form conducting films or a radio wave absorbing panel according to the invention.

In FIG. 3, a matrix of conducting films 5B is made up of multiple rectangular film pieces arrayed in the form of a matrix. The width of the film pieces in their row and column directions are respectively H and V, and the gap between pieces adjacent in the row and column directions is D.

Figure 4A:
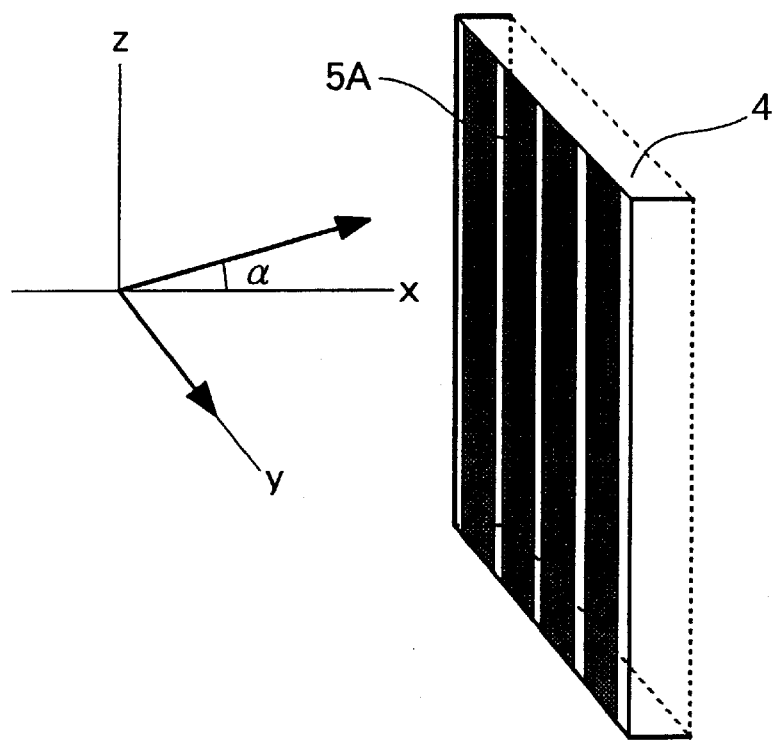
FIG. 4A is a construction view of an insulating substrate on the surface of which are formed stripe-form conducting films.
Figures 4B, 4C:
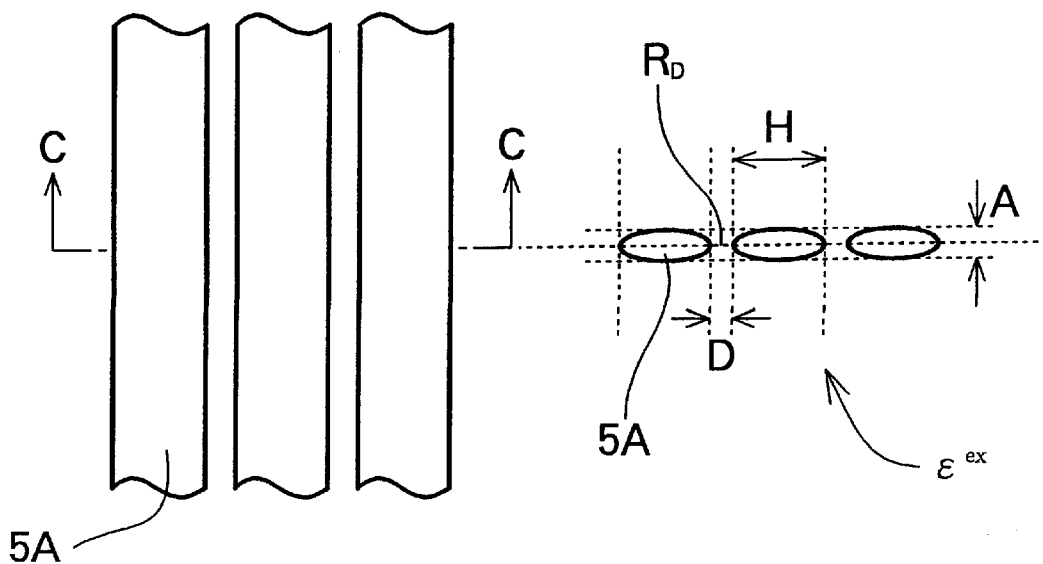
FIG. 4B is a plan view of the stripe-form conducting films.
FIG. 4C is a sectional view on the line C—C in FIG. 4B.

FIGS. 4A through 4C are views of an insulating substrate according to the invention made by forming stripe-shaped conducting films on a substrate.

FIG. 4A shows the construction of a middle insulating substrate 4 having stripe-form conducting films 5A formed on its surface and also illustrates the action of a uniform radio wave field impressed on the stripe-form conducting films 5A. FIG. 4B shows the pattern of the stripe-form conducting films 5A. FIG. 4C is a sectional view of the stripe-form conducting films 5A shown in FIG. 4B on the line C—C.

In FIG. 4A, the y-axis direction vector shows the direction of the uniform radio wave field and the vector having the x-z coordinate inclination α shows the propagation direction of the electromagnetic waves.

In FIG. 4C, the major axis of the flat ellipse (the width of the stripe-form film) of each of the stripe-form conducting films 5A in cross-section is H, the minor axis (the thickness of the film) is A, and the gap between adjacent stripe-form films is D. The insulation resistance between adjacent stripe-shaped films will be written $R_D$, and the relative permittivity of the surroundings of the flat elliptical films will be written $\epsilon^{eX}$.

Generally, when two insulating substrates on an entire surface of each of which a conducting film has been formed are disposed in parallel (i.e. when in FIG. 1 there is no middle insulating substrate 4 but rather just an air layer 8), to produce radio wave absorption accompanying resonance caused by interference of multiple reflections, it is necessary to make the distance between the two substrates about ¼ of the wavelength of the radio waves. Therefore, because when the space between the two substrates is an air layer its relative permittivity is 1, with respect to radio waves of for example 100 MHz in frequency the distance between the two substrates must be 75 cm. When glass, which has a high relative permittivity, is used instead of air, because its relative permittivity is about 7, the distance between the two substrates becomes about 28 cm. To reduce the distance between the two substrates to about 10 cm, with respect to radio waves of frequency 100 MHz, a medium having a relative permittivity of several tens or more becomes necessary.

Research carried out by the present inventors has shown that the conducting films 5A divided up in the form of stripes shown in FIG. 4C have the property that with respect to a field of radio waves perpendicular to the centerline of a gap between adjacent stripe-form films, under certain conditions, if the film thickness of the stripe-form conducting films 5A is written Acm and the major axis of the flat ellipse of the cross-sections of the films is written Hcm, they have a huge real relative permittivity of about H/A (in a normal case about $10^7$), and also can be regarded as a continuous medium of thickness Acm.

A radio wave absorbing panel according to the invention has the same function as when a dielectric film having this kind of huge real permittivity is disposed between two insulating substrates disposed in parallel on each of which a continuous conducting film is formed, and can effect a large phase change in radio waves across the conducting films divided up in the form of stripes or a matrix. As a result, even when the distance between the two insulating substrates (the panel thickness) is much less than ¼ of a wavelength, it is possible to produce resonance derived from interference of multiple reflections and thereby realize a high radio wave absorbency.

Next, an approximate calculation of the above-mentioned huge real permittivity will be carried out on the basis of a simple model.

Modeling was carried out by taking a stripe-form conducting film 5A as a flat elliptical prism extending in a direction perpendicular to the orientation of a radio wave field (the y-axis direction) as shown in FIG. 4C, forming the gaps between the adjacent elliptical prisms as an insulation resistance $R_D$ and a distance (width) D, and surrounding the elliptical prism with a dielectric of relative permittivity $\epsilon^{eX}$; the polarization of a case wherein a uniform outside field is impressed on this one elliptical prism was computed, and by space-averaging over the whole layer of the divided insulating films the effective relative permittivity $\Sigma_{BM}$ of this virtual dielectric layer is given by Exp. (1).

$$\sum_{BM} = 1 + \frac{\pi(H/\lambda)[\{\epsilon^{eX}\kappa + \frac{(\epsilon^{eX}-1)(D \cdot R_{BM}/R_D)\} - (H \cdot R_{BM}/R_D)]}{(\pi A/\lambda)\{1 + (H/\lambda)^2(2\pi)^2(R_{BM}/Z_O)^2\}} + (H+D)(Z_O/2R_D) + i\frac{2\pi^2\epsilon^{eX}(H/\lambda)^2(\kappa + D \cdot R_{BM}/R_D)(R_{BM}/Z_O)}{(\pi A/\lambda)\{1 + (H/\lambda)^2(2\pi)^2(R_{BM}/Z_O)^2\}} \quad (1)$$

where:

A is the minor axis of the elliptical prism (equivalent to the conducting film thickness);

H is the major axis of the elliptical prism (equivalent to the width of the stripe-form conducting films);

D is the width of the high-resistance part dividing adjacent stripe-form films;

k is the coverage, $(\pi/4)AH/\{A(H+D)\}$;

λ is the wavelength [cm] in a vacuum of the incident radio waves;

$Z_0$ is the space impedance of a vacuum, $4\pi c/10^9 \approx 377\Omega$;

$R_{BM}$ is the sheet resistivity of the stripe-form film [Ω/□]; and $R_D$ is the insulation resistance between adjacent stripe-form films of unit length [cmΩ].

When the insulation resistance $R_D$ of the gaps between the stripe-form films is sufficiently large, by taking $R_D$ as infinity, Exp. (1) can be simplified to Exp. (2).

$$\sum_{BM} = 1 + \frac{\epsilon^{eX}(H/A)}{1 + (H/\lambda)^2(2\pi)^2(R_{BM}/Z_O)^2} + 2\pi i \frac{\epsilon^{eX}\kappa(H/A)(H/\lambda)(R_{BM}/Z_O)^2}{1 + (H/\lambda)^2(2\pi)^2(R_{BM}/Z_O)^2} \quad (2)$$

Also, when the major axis H of the elliptical conducting films is set to a value sufficiently smaller than the wavelength λ of the incident radio waves (H<<λ) and the sheet resistivity $R_{BM}$ of the conducting films is set to a value sufficiently smaller than the space impedance of a vacuum $Z_0$ ($R_{BM}<<Z_0$), Exp. (2) can be simplified to Exp. (3).

$$\Sigma_{BM} \rightleftharpoons \epsilon^{ex}k \ (H/A) \qquad (3)$$

From Exp. (3), the effective relative permittivity $\Sigma_{BM}$ of the virtual dielectric layer of the stripe-form conducting films 5A shown in FIGS. 4A through 4C is equivalent to a huge real relative permittivity (about $10^7$).

Using the relative permittivity $\Sigma_{BM}$ shown in Exp. (3), the radio wave transmission, reflection and absorption characteristics of when with two insulating substrates on each of which is formed a continuous conducting film disposed in parallel an insulating substrate on which is formed a conducting film divided up into stripes is interposed therebetween were calculated using Maxwell's equations.

Figure 5:
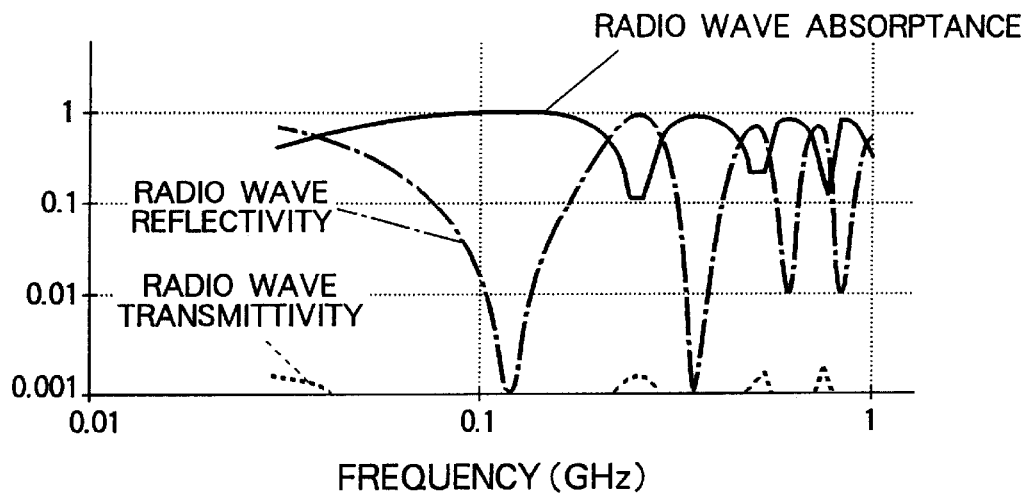
FIG. 5 is a radio wave transmission, reflection and absorption frequency characteristic chart for a case where an insulating substrate on which conducting films in the form of stripes are formed is not interposed between two facing insulating substrates.
Figure 6:
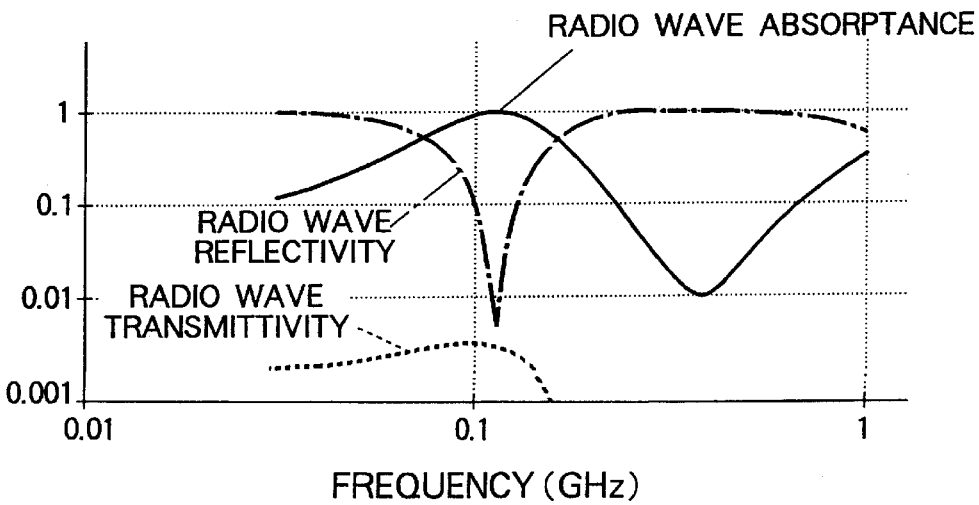
FIG. 6 is a radio wave transmission, reflection and absorption frequency characteristic chart for a case where an insulating substrate on which conducting films in the form of stripes are formed is interposed between two insulating substrates according to the invention.

Calculated results of radio wave transmission, reflection and absorption frequency characteristics for when with two insulating substrates on each of which is formed a continuous conducting film disposed in parallel an insulating substrate on which is formed a conducting film divided up into stripes is not and is interposed therebetween are shown in FIG. 5 and FIG. 6, respectively.

FIG. 5 shows radio wave transmission, reflection and absorption frequency characteristics of when an insulating substrate on which is formed a conducting film divided up into stripes is not provided. In this case, the thickness of the air layer between the two insulating substrates on each of which a continuous conducting film is formed is taken as 60 cm.

In FIG. 5, in the vicinity of the frequency 100 MHz, the radio wave absorptance is very high (absorptance=1), while the radio wave reflectivity decreases greatly (reflectivity= 0.001; attenuation 60 dB).

FIG. 6 shows radio wave transmission, reflection and absorption frequency characteristics of when a middle insulating substrate on which is formed a conducting film divided up into stripes according to the invention is interposed between first and second insulating substrates. The gap between the first insulating substrate 2 and the middle insulating substrate 4 shown in FIG. 1 was taken as 15 cm and the gap between the middle insulating substrate 4 and the second insulating substrate 6 as 1 cm.

In FIG. 6, in the vicinity of the frequency 100 MHz, the radio wave absorptance is very high (absorptance=1), while the radio wave reflectivity decreases greatly (reflectivity= 0.01; attenuation 40 dB).

In this way, in a radio wave absorbing panel according to the invention, because a middle insulating substrate on which is formed a conducting film divided up into stripes is provided between at least two insulating substrates on each of which a continuous conducting film is formed, even when the panel width is reduced to ¼ compared to when there is no middle insulating substrate on which is formed a conducting film divided up into stripes, the radio wave reflectivity can be reduced and the absorptance increased.

In the characteristics of the continuous conducting films used in the radio wave absorbing panel of the invention there is an action of reflecting nearly 100% of radio waves and an action of reflecting or transmitting some radio waves and absorbing some.

To obtain the former characteristic, a conducting film having a small sheet resistivity $R_{BM}$ is suitable, but to make the sheet resistivity $R_{BM}$ small it is necessary to make the conducting film thick, and its manufacturing cost increases. Also, if a metal film is used as the conducting film, when the conducting film is made thick its transparency to visible light decreases. For this reason, to eliminate problems of manufacturing cost and visible light transparency, the sheet resistivity $R_{BM}$ is set between 1Ω/□ and 3000Ω/□. Most preferably, the sheet resistivity $R_{BM}$ is set between 5Ω/□ and 20Ω/□ so that visible light transparency which is not much different from that of ordinary transparent glass can be obtained.

In the case of the latter characteristic, when multiple insulating substrates coated with continuous conducting films are used the radio wave absorption characteristics variously change, and when the sheet resistivity $R_{BM}$ is made greater than 3000Ω/□ there is too much transmission of radio waves and it is difficult to obtain sufficient absorption, and when on the other hand the sheet resistivity $R_{BM}$ is made less than 50Ω/□ it becomes difficult to obtain sufficient absorption because there is too much radio wave reflection. Therefore, the sheet resistivity $R_{BM}$ is set preferably between 200Ω/□ and 1500Ω/□.

In the characteristics of the stripe-form or matrix-form conducting films, to raise the radio wave absorptivity the effective relative permittivity $\Sigma_{BM}$ must be made large. When the real part of the relative permittivity $\Sigma_{BM}$ is not sufficiently large compared with the imaginary part, resonance does not readily occur and the absorptance falls, and therefore it is important for the major axis H of the elliptical conducting films to be set to a value sufficiently smaller than the wavelength λ of the incident radio waves (H<<λ) and for the sheet resistivity of the conducting films to be set sufficiently smaller than the space impedance of a vacuum $Z_0$ ($R_{BM}<<Z_0$).

From Exp. (3), the relative permittivity $\Sigma_{BM}$ can be set to a large value when the value of the width H of the stripe-form conducting films is made large, but because the wavelength λ of the arriving radio waves when they are in the VHF band is about 300 cm, to obtain H<<λ the width H of the stripe-form conducting films is made smaller than 50 cm.

When the width H of each stripe-form conducting film is made small, the relative permittivity $\Sigma_{BM}$ becomes small, whereby the radio wave absorptance becomes small, and also the conducting films become difficult to manufacture. For this reason, the value of H is normally set to at least 1 cm (H≧1 cm). Stated otherwise, the width H of each stripe-form conducting film falls in the range of 1 cm≦H≦50 cm.

For the same reason as in the stripe-form conducting film, the row-direction pattern width V of each matrix-form conducting film shown in FIG. 3 is also in the range of 1 cm≦V≦50 cm.

The sheet resistivity $R_{BM}$ of the stripe-form conducting films must as mentioned above be made a value sufficiently smaller than the space impedance of a vacuum $Z_0$ ($R_{BM}<<Z_0 \rightleftharpoons 377Ω$), and normally the sheet resistivity $R_{BM}$ is set to be not more than 40Ω/□ ($R_{BM}^2 40Ω/□$).

However, to reduce the sheet resistivity $R_{BM}$ it is necessary to increase the thickness of the conducting films but then manufacturing cost increases. When the film thickness of the conducting films and metal films are used as the conducting films, there arises the problem that transmittivity of visible light decreases. For this reason the sheet resistivity $R_{BM}$ is set to at least 1Ω/□ ($R_{BM} \geq 1Ω/□$) and preferably from 5Ω/□ to 20Ω/□.

In the conditions for the real part of the relative permittivity $\Sigma_{BM}$ being larger than the imaginary part, it is necessary for the insulation resistance $R_D$ of the gap between adjacent stripe-form films to be large, as shown in Exp. (4).

$$\pi(H/\lambda)\epsilon^{ex}k>>(H+D) \ (Z_0/2R_D) \qquad (4)$$

Normally, the width H of the stripe-form conducting films is generally set amply larger than adjacent the stripe-form film gap D (H>>D), and applying this condition to Exp. (4) yields Exp. (5).

$$R_D >> 2\lambda Z_0/(\pi^2 \epsilon^{ex}) \quad (5)$$

When radio wave wavelength λ=300 cm, relative permittivity $\epsilon^{ex}$=7 (glass, and $Z_0$=377Ω are substituted into Exp. (5), insulation resistance of stripe-form film gap $R_D$>>3300 cmΩ is obtained, and normally the insulation resistance $R_D$ is set greater than 30,000 cmΩ.

When on a conducting film divided up in one direction in the form of stripes a field of radio waves is impressed in the length direction of the stripes, the effect of the stripe-form conducting films discussed above cannot be expected, and the same characteristics as those of a continuous conducting film are obtained.

To obtain the same radio wave absorbing characteristics as stripe-form conducting films with respect to an electric field of any orientation, the conducting films are set to a matrix form. In the matrix shape, the conditions of the unidirectional stripe shape mentioned above must be satisfied.

Next, as a preferred embodiment of a radio wave absorbing panel according to the invention, a panel made by forming on one of the insulating substrates constituting the panel shown in FIG. 1 a conducting film having an action of reflecting nearly 100% of radio waves and forming on the other of the insulating substrates a conducting film having the action of partially reflecting and transmitting and partially absorbing radio waves and disposing between these two substrates at least one insulating substrate on a surface of which are formed matrix-form conducting films will be described.

In this kind of radio wave absorbing panel, compared with a case wherein an insulating substrate having the function of partially reflecting and transmitting and partially absorbing radio waves is disposed over the entire face of the outer side of the panel, the thickness of the air layer can be reduced to about ½, and also the effect of the insulating substrate on which the stripe-form or matrix-form conducting films are formed can be made the equivalent of the effect of double the number of such substrates.

The sheet resistivity $R_{BM}$ of the continuous conducting film having the function of reflecting nearly 100% of radio waves is set to 1Ω/□ to 30Ω/□. A particularly optimal sheet resistivity $R_{BM}$ is 5Ω/□ to 20Ω/□. However, when transparency to light is not required, a conducting film having a lower sheet resistivity $R_{BM}$ can be used and a more marked effect can thereby be obtained.

The sheet resistivity $R_{BM}$ of the continuous conducting film having the function of partially reflecting and transmitting and partially absorbing radio waves is set to 50Ω/□ to 3000Ω/□. A particularly optimal sheet resistivity $R_{BM}$ is 200Ω/□ to 1500Ω/□.

To apply a radio wave absorbing panel according to the invention to a window opening of a building it is necessary to use substrates which are transparent to visible light as the insulating substrates, and transparent plate glass is suitable. Also for the conducting films formed on the insulating substrates, conducting films transparent to light are used. In particular, to make the sheet resistivity of the stripe-form or matrix-form conducting films low and also maintain transparency to light, the film material must be selected from a limited range of alternatives. As film materials with which this kind of function can be realized, for example transparent conducting films composed mainly of $SnO_2$ or $In_2O_3$ or metal films composed mainly of Ag, Au, Cu and Al are suitable.

Because these conducting films or metal films reflect near-infrared rays of sunlight and have a low heat ray radiation function, in addition to their radio wave absorption function, when the panel is used as window glass, they enable energy of room air-conditioning to be saved.

When these film materials, and particularly metal films mainly composed of either Ag, Au, Cu or Al are used, to ensure durability of the films, multiple layer glass made by sealing dry air between glass substrates, or laminated glass made by inserting resin between glass substrates, is preferably used. To impart a radio wave absorbing action using dry air or resin, the thicknesses of the air layers, the thicknesses of the glass substrates and the thicknesses of the resin layers are set on the basis of the conditions discussed above.

Preferred embodiments of the invention will be described specifically along with comparison examples.

First Preferred Embodiment

Using an in-line sputtering apparatus, a gas of 90 mol % nitrogen, 10 mol % oxygen was introduced and by reactive sputtering using a Cr metal target an oxide nitride CrOxNy film was formed on a sheet of soda lime silica glass of thickness 4 mm. The thickness of this film was about 40 nm and the sheet resistivity of the film was about 400Ω/□.

Next, by means of an in-line sputtering apparatus, on a soda lime silica glass substrate of thickness 4 mm, films of ZnO, Ag and ZnO were formed in order from the substrate side as an Ag film. The in-line sputtering apparatus was controlled so that the respective film thicknesses were 40 nm, 15 nm and 40 nm. The ZnO films have the role of maintaining the durability of the Ag film. The sheet resistivity of the film obtained was about 5Ω/□.

Also, using the same in-line sputtering apparatus, a thin stainless steel plate mask of thickness about 0.5 mm having square holes of side length 5 cm formed therein with gaps of 4 mm between adjacent holes was prepared and placed on a soda lime silica glass substrate of thickness 4 mm, and films of ZnO, Ag and ZnO were formed in order from the glass substrate side with the in-line sputtering apparatus being controlled so that the film thicknesses were respectively 40 nm, 15 nm and 40 nm.

The mask was then removed to form 5 cm-square transparent ZnO/Ag/ZnO films on the substrate in the form of a matrix. The sheet resistivity of the films was about 5Ω/□, and the insulation resistance between adjacent films was over 20MΩ.

These three glass substrates were then cut into squares of side 120 cm and used to construct a laminate of the structure: 4 mm glass/CrOxNy:0.6 cm air layer:matrix of ZnO/Ag/ZnO films/4 mm glass:2.4 cm air layer:ZnO/Ag/ZnO film/4 mm glass.

When the radio wave reflectivity and the radio wave transmittivity from 200 MHz to 1 GHz of this laminate were measured, it was found that at around 500 MHz the reflectivity decreased and there was a region where strong resonant absorption occurred.

Figure 7:
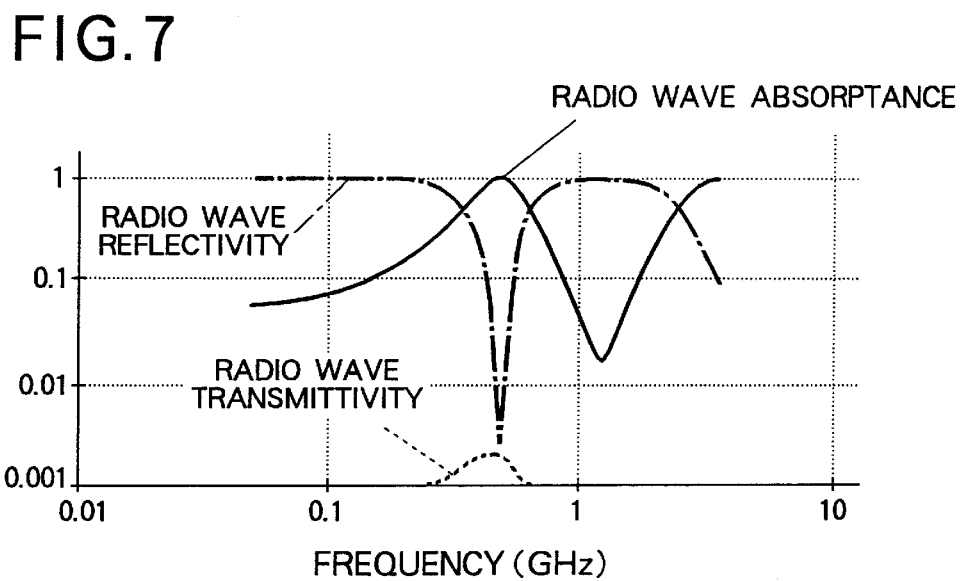
FIG. 7 is a graph showing theoretical calculation results obtained for a first preferred embodiment of the invention, Preferred Embodiment 1.

Computed results of radio wave reflectivity and absorption characteristics obtained using the approximate theory discussed above for this panel are shown in FIG. 7.

First Comparison Example

A laminate was made by replacing the glass substrate of thickness 4 mm having a matrix-form Ag film formed thereon of the first preferred embodiment with a glass substrate having no film formed on it, and the radio wave reflectivity and the radio wave transmittivity from 200 MHz to 1 GHz of this laminate were measured. The result was that although there was a decrease in reflectivity and an increase in transmittivity at around 1 GHz, at below 1 GHz there was no resonant absorption.

Figure 8:
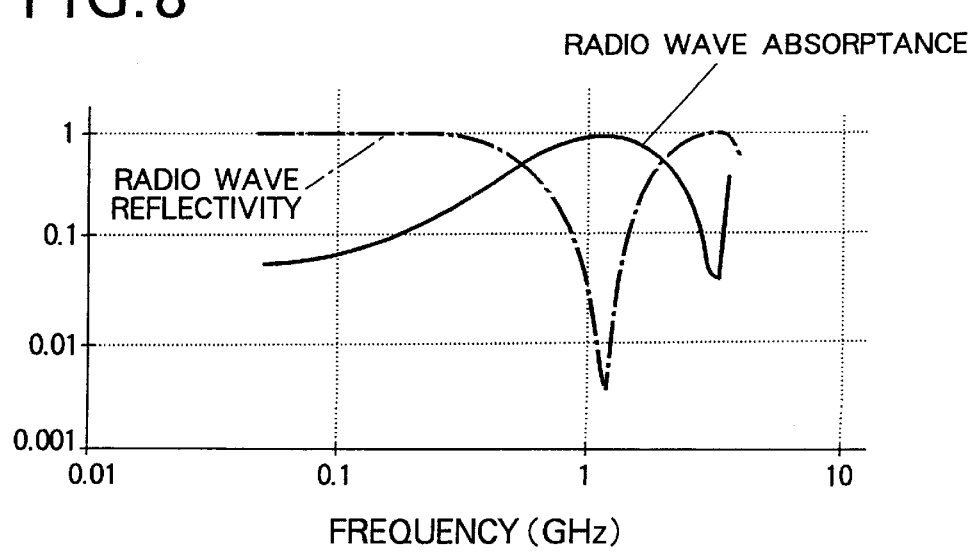
FIG. 8 is a graph showing theoretical calculation results obtained for a first comparison example of the invention, Comparison Example 1.

In theoretically computed results of radio wave reflectivity and transmittivity obtained for this construction, as shown in FIG. 8 there was resonant absorption at around 1.2 GHz.

To induce resonant absorption at around the same frequency of 500 MHz as the first preferred embodiment, it was necessary to increase the thickness of the 2.5 cm air layer to 10 cm.

Second Preferred Embodiment

An indium tin oxide (ITO) sintered target was mounted in an in-line sputtering apparatus and a gas made by adding 20 mol % oxygen to Ar was introduced to form an ITO film of thickness about 60 nm on a soda lime silica glass substrate of thickness 4 mm. The film-forming conditions were controlled so as to bring the sheet resistivity of the film to about 400Ω/□.

A laminate was made by substituting this substrate for the substrate having the CrOxNy film formed thereon of the first preferred embodiment and the radio wave reflectivity and transmittivity from 200 MHz to 1 GHz of this laminate were measured. The result was that the laminate exhibited substantially the same characteristics as the first preferred embodiment.

Third Preferred Embodiment

Using an in-line sputtering apparatus, $SnO_2$, Ag and $SnO_2$ films were formed on a soda lime silica glass substrate of thickness 4 mm. The film thicknesses were respectively controlled to 40 nm, 15 nm and 40 nm, and a film of sheet resistivity 5Ω/□ was obtained.

The film face of this glass substrate was scored in a checkerboard pattern using a steel needle and thereby divided up into squares of side length about 20 cm. When the divisions were viewed with an optical microscope the film was seen to have been cut away in lines of just under 200 μm in width. The electrical resistance between adjacent conducting films thus divided was generally over about 50kΩ. A laminate was made by substituting this glass substrate with films in the form of a matrix of 20 cm squares formed thereon for the glass substrate having the matrix of ZnO/Ag/ZnO films formed thereon of the first preferred embodiment, and the radio wave reflectivity and transmittivity from 200 MHz to 1 GHz of this laminate were measured. The result was that a slightly weaker resonant absorption than that in the first preferred embodiment occurred at around 250 MHz.

Second Comparison Example

Using an in-line sputtering apparatus, ITO, Ag and ITO films were formed on a glass substrate. The film thicknesses were respectively controlled to 40 nm, 15 nm and 40 nm, and a film of sheet resistivity about 5Ω/□ was obtained.

In the same way as in the third preferred embodiment, the film face was scored in a checkerboard pattern using a steel needle and thereby divided up into squares of side length about 20 cm. The electrical resistance between adjacent conducting films thus divided was less than 50Ω (about 1000 cmΩ as $R_D$).

A laminate was made by substituting this glass substrate with films in the form of a matrix of 20 cm squares formed thereon for the glass substrate having the matrix of ZnO/Ag/ZnO films formed thereon of the first preferred embodiment, and the radio wave reflectivity and transmittivity from 200 MHz to 1 GHz of this laminate were measured. The result was that although there was a gentle decrease of reflectivity around frequency 250 MHz, resonant absorption did not occur.

Fourth Preferred Embodiment

The Cr oxide nitride film CrNxOy of sheet resistivity about 400Ω/□ mentioned in the first preferred embodiment was formed on glass of thickness 10 mm and this was cut into a square of side length 80 cm and stood perpendicular to a floor surface.

Cubes of foam styrol of side length 1 cm were then affixed to the film face side of this glass as spacers at lattice points about 30 cm apart.

Colorless float glass of plate thickness 4 mm coated with a transparent conducting film consisting of a $SnO_2$ film of sheet resistivity about 10Ω/□ doped with fluorine of film thickness about 300 nm was cut into strips of width 20 cm, length 180 cm, and these were lined up closely in the longitudinal direction on a plate of plastic and fixed to make a panel of side length 180 cm.

This panel was stood vertical and placed against the 10 mm-thick glass with the foam styrol spacers therebetween.

Also, so as to sandwich this panel and parallel therewith another panel having aluminum foil of thickness 15 μm stretched over it was so disposed that the thickness of an air layer formed between the panels could be varied.

Linearly polarized radio waves were then directed at the laminate thus constructed from the 10 mm-thick glass side, and its reflectivity in a frequency range of 50 MHz to 500 MHz was measured.

When the polarization of the radio wave field was horizontal and the thickness of the variable air layer was about 15 cm, at about 100 MHz there was a marked fall in reflectivity and strong resonant absorption occurred.

Third Comparison Example

When radio waves whose field was polarized vertically were directed at the laminate construction of the fourth preferred embodiment, the reflectivity in the frequency range of 50 MHz to 500 MHz was substantially 100%.

Fourth Comparison Example

From the laminate construction of the fourth preferred embodiment, the panel made by lining up 20 cm×180 cm pieces of glass coated with transparent conducting film was removed and the thickness of the air layer was varied to investigate the condition under which resonant absorption with respect to horizontally polarized waves arose at around 100 MHz. It was found that a thickness of the air layer of about 70 cm was necessary.

Fifth Preferred Embodiment

A soda lime silica glass substrate of thickness 4 mm coated with a continuous ITO film of sheet resistivity about 400Ω/□, a soda lime silica glass substrate of thickness 18 mm coated with transparent conducting films made by forming a $SnO_2/Ag/SnO_2$ film of sheet resistivity about 5Ω/□ and then dividing this up into a matrix of squares of side length 5 cm by scoring with a steel needle, and a soda lime silica glass substrate of thickness 4 mm coated with a continuous ZnO/Ag/ZnO/Ag/AnO film of sheet resistivity about 3Ω/□ were laminated together with resin interposed therebetween to form a laminate panel of the construction: 4 mm glass/ITO film:0.36 mm resin:divided $SnO_2$/Ag/$SnO_2$ film/18 mm glass:0.36 mm resin:ZnO/Ag/ZnO/Ag/ZnO film/4 mm glass.

Radio waves were directed at this laminate panel from the side of the glass substrate coated with the ITO film, and its radio wave reflectivity and radio wave transmittivity from 400 MHz to 1.5 GHz were measured. It was found that resonant absorption occurred at around 600 MHz.

Fifth Comparison Example

A laminate glass was constructed by using a soda lime silica glass substrate of thickness 18 mm not coated with anything in place of the soda lime silica glass substrate of thickness 18 mm on which the matrix of transparent conducting films was formed in the laminate construction of the fifth preferred embodiment.

When radio waves were directed at this laminate panel from the side of the glass substrate coated with the ITO film and the radio wave reflectivity and radio wave transmittivity from 400 MHz to 1.5 GHz were measured, resonant absorption occurred at around 1.2 GHz.

Industrial Applicability

As described above, with this invention it is possible to increase the relative permittivity of a radio wave absorbing panel and obtain a thin radio wave absorbing panel having excellent radio wave absorptance as well as excellent transparency to light. Thus, a radio wave absorbing panel according to the invention is ideal as a panel for installation in window openings of buildings.

What is claimed is:

1. A radio wave absorbing panel comprising:
at least two insulating substrates disposed in parallel a predetermined distance apart on at least one side of each of which is formed a continuous conducting film; and
at least one insulating substrate disposed between these insulating substrates in parallel therewith on a surface of which are formed conducting films disposed in the form of stripes or in the form of a matrix.

2. A radio wave absorbing panel according to claim 1, wherein the sheet resistivity of the continuous conducting film is in the range of 1Ω/□ to 3000Ω/□, and when the width and the sheet resistivity of each of the conducting films disposed in the form of stripes are respectively written Hcm and $R_{BM}$Ω/□ and the insulation resistance of the insulating substrate on which the conducting films disposed in the form of stripes are formed is written $R_D$cmΩ, then H, $R_{BM}$ and $R_D$ have the following values:

1 cm≦H≦50 cm

1Ω/□≦$R_{BM}$≦40Ω/□

$R_D$≧30,000 cmΩ.

3. A radio wave absorbing panel according to claim 1, wherein the sheet resistivity of the continuous conducting film is in the range of 1 Ω/□ to 3000Ω/□, and when the width, the length and the sheet resistivity of each of the conducting films disposed in the form of a matrix are respectively written Hcm, Vcm and $R_{BM}$Ω/□ and the insulation resistance of the insulating substrate on which the conducting films disposed in the form of a matrix are formed is written $R_D$cm, then H, V, $R_{BM}$ and $R_D$ have the following values:

1 cm≦H≦50 cm 1 cm≦V≦50 cm

1Ω/□≦$R_{BM}$≦40Ω/□

$R_D$≧30,000 cmΩ.

4. A radio wave absorbing panel according to claim 1, wherein the sheet resistivity of the continuous conducting film formed on the surface of one of the insulating substrates is in the range of 1Ω/□ to 30Ω/□ and the sheet resistivity of the continuous conducting film formed on the surface of another of the insulating substrates is in the range of 50Ω/□ to 3000Ω/□, and when the width and the sheet resistivity of each of the conducting films disposed in the form of stripes are respectively written Hcm and $R_{BM}$Ω/□ and the insulation resistance of the insulating substrate on which the conducting films disposed in the form of stripes are formed is written $R_D$cmΩ, then H, $R_{BM}$ and $R_D$ have the following values:

1 cm≦H≦50 cm

1Ω/□≦$R_{BM}$≦40Ω/□

$R_D$≧30,000 cmΩ.

5. A radio wave absorbing panel according to claim 1, wherein the sheet resistivity of the continuous conducting film formed on the surface of one of the insulating substrates is in the range of 1Ω/□ to 30Ω/□ and the sheet resistivity of the continuous conducting film formed on the surface of another of the insulating substrates is in the range of 50Ω/□ to 3000Ω/□, and when the width, the length and the sheet resistivity of each of the conducting films disposed in the form of a matrix are respectively written Hcm, Vcm and $R_{BM}$Ω/□ and the insulation resistance of the insulating substrate on which the conducting films disposed in the form of a matrix are formed is written $R_D$cmΩ, then H, V, $R_{BM}$ and $R_D$ have the following values:

1 cm≦H≦50 cm 1 cm≦V≦50 cm

1Ω/□≦$R_{BM}$≦40Ω/□

$R_D$≧30,000 cmΩ.

6. A radio wave absorbing panel according to claim 1, wherein transparent plate glass is used as the insulating substrates and the stripe or matrix form conducting films are transparent conducting films composed mainly of $SnO_2$ or $In_2O_3$ or are metal films composed mainly of Ag, Au, Cu or Al.

7. A radio wave absorbing panel according to claim 1, wherein dry air is sealed in spaces between the at least two insulating substrates and the at least one insulating substrate on the surface of which are formed conducting films disposed in the form of stripes or a matrix.

8. A radio wave absorbing panel according to claim 1, wherein resin is sealed in spaces between the at least two insulating substrates and the insulating substrate on the surface of which are formed conducting films disposed in the form of stripes or a matrix to form a laminated glass structure.

* * * * *